United States Patent
Ide et al.

(10) Patent No.: US 8,373,191 B2
(45) Date of Patent: Feb. 12, 2013

(54) ORGANIC ELECTROLUMINESCENCE DEVICE AND METHOD OF FABRICATING THE SAME

(75) Inventors: Nobuhiro Ide, Katano (JP); Norihiro Ito, Suita (JP); Hiroya Tsuji, Kyoto (JP); Yuko Matsuhisa, Moriguchi (JP)

(73) Assignee: Panasonic Corporation, Kadoma-shi (JP)

( * ) Notice: Subject to any disclaimer, the term of this patent is extended or adjusted under 35 U.S.C. 154(b) by 196 days.

(21) Appl. No.: 12/737,552

(22) PCT Filed: Jul. 27, 2009

(86) PCT No.: PCT/JP2009/063344
§ 371 (c)(1),
(2), (4) Date: Jan. 25, 2011

(87) PCT Pub. No.: WO2010/013673
PCT Pub. Date: Feb. 4, 2010

(65) Prior Publication Data
US 2011/0127561 A1    Jun. 2, 2011

(30) Foreign Application Priority Data

Jul. 30, 2008  (JP) .................. 2008-196997
Jul. 23, 2009  (JP) .................. 2009-172426

(51) Int. Cl.
*H01L 31/04*   (2006.01)
(52) U.S. Cl. ............. 257/99; 257/40; 257/E51.018; 438/82; 438/99
(58) Field of Classification Search .......... 257/40, 257/99, E51.018; 438/82, 99
See application file for complete search history.

(56) References Cited

U.S. PATENT DOCUMENTS

| | | | |
|---|---|---|---|
| 5,932,895 A | * | 8/1999 | Shen et al. ............... 257/89 |
| 6,107,734 A | | 8/2000 | Tanaka et al. |
| 7,525,129 B2 | * | 4/2009 | Masuda et al. ........... 257/103 |

(Continued)

FOREIGN PATENT DOCUMENTS

| | | |
|---|---|---|
| JP | H11-329748 | 11/1999 |
| JP | 2003-272860 A | 9/2003 |

(Continued)

OTHER PUBLICATIONS

PCT International Search Report dated Nov. 10, 2009, issued for PCT/JP2009/063344.

(Continued)

*Primary Examiner* — Allan R Wilson
(74) *Attorney, Agent, or Firm* — Edwards Wildman Palmer LLP

(57) ABSTRACT

[Problem] The present invention aims to provide an electroluminescence device with an improved intermediate layer, for achieving a superior durability and sustainability performance thereof.
[Solution] The present invention refers to organic electroluminescence devices having a plurality of light emitting layers 4 between an anode 1 and a cathode 2 with the intermediate layer 3 being interposed between two of the light emitting layers. The intermediate layer 3 comprises one layer 3a selected from a group consisting of a charge transfer complex layer made of a charge transfer complex, a metal layer made of a metal having a work function of 3.7 eV or less, and a metal compound layer made of a compound of the metal; an electrically conductive material-containing light transmissive layer 3b; a charge transport organic material layer 3c formed of a charge transport organic material; and a hole injection material layer 3d formed of a hole injection material, which are superimposed in this order. The charge transport material layer 3c is formed to have a thickness in a range of 0.5 nm to 30 nm.

20 Claims, 3 Drawing Sheets

U.S. PATENT DOCUMENTS

| | | | |
|---|---|---|---|
| 2003/0170491 A1* | 9/2003 | Liao et al. | 428/690 |
| 2003/0189401 A1 | 10/2003 | Kido et al. | |
| 2006/0250079 A1* | 11/2006 | Kwok et al. | 313/506 |
| 2006/0263629 A1 | 11/2006 | Aziz et al. | |
| 2006/0289882 A1 | 12/2006 | Nishimura et al. | |
| 2007/0007882 A1 | 1/2007 | Fukuoka et al. | |
| 2007/0181887 A1 | 8/2007 | Kijima et al. | |
| 2007/0182317 A1* | 8/2007 | Kido et al. | 313/504 |
| 2007/0205411 A1 | 9/2007 | Itai | |
| 2009/0230415 A1* | 9/2009 | Ide et al. | 257/98 |
| 2010/0291716 A1* | 11/2010 | Suh et al. | 438/29 |
| 2012/0012820 A1* | 1/2012 | Endo et al. | 257/40 |
| 2012/0061655 A1* | 3/2012 | Kawakami et al. | 257/40 |

FOREIGN PATENT DOCUMENTS

| | | |
|---|---|---|
| JP | 2005-135600 A | 5/2005 |
| JP | 2006-049393 A | 2/2006 |
| JP | 2006-066380 A | 3/2006 |
| JP | 2006-173550 A | 6/2006 |
| JP | 2006-332048 A | 12/2006 |
| JP | 2007/242733 A | 9/2007 |
| JP | 2008-078414 A | 4/2008 |
| JP | 2008-218396 A | 9/2008 |
| WO | WO-2005/009087 A1 | 1/2005 |
| WO | WO-2006/115848 A1 | 11/2006 |

OTHER PUBLICATIONS

H. Kanno, et al. "High Efficiency Stacked Organic Light-Emitting Diodes Employing $LI_2O$ as a Connecting Layer," Japanese Journal of Applied Physics, vol. 45, No. 12, 2006, pp. 9219-9223.

* cited by examiner

ORGANIC ELECTROLUMINESCENCE DEVICE AND METHOD OF FABRICATING THE SAME

TECHNICAL FIELD

This invention relates to organic electroluminescence devices and methods of fabricating the same. Such an organic electroluminescence device can be utilized as a luminaire light source, a liquid crystal display backlight, a flat panel display, and so on.

BACKGROUND ART

Some of organic light emitting devices are referred to as organic electroluminescence devices. For example, such an organic light emitting device comprises a transparent electrode serving as an anode, a hole transport layer, a light emitting layer (an organic light emitting layer), an electron injection layer and a cathode, which are superimposed in this order and provided on one side of a transparent substrate. The organic electroluminescence device is configured to recombine electrons injected from the electron injection layer with holes injected from the hole transport layer, at the light emitting layer, so as to cause a light emission within the light emitting layer. The device is designed to propagate outwards the light emitted from the light emitting layer, through the transparent electrode and the transparent substrate.

The organic electroluminescence device is designed to give a self-emission light in various wavelengths, with a relatively high yield. Such organic electroluminescence devices are expected to be applied for production of displaying apparatuses, light emitters such as flat panel displays, and light sources such as liquid-crystal displaying backlights and luminaires. Some of organic electroluminescence devices have already been developed for practical uses.

However, the organic electroluminescent device suffers from problems arising from a trade-off relationship between brightness and durability. That is, the organic electroluminescent device may suffer from poor durability, when being configured to give a clear image or radiate a light with a high brightness.

The organic light emitting device has been developed in view of such problems, as disclosed in patent references 1 to 5. Each of the organic light emitting devices contains a plurality of light emitting layers disposed between the anode and the cathode. In this device, the plural light emitting layers are electrically connected to each other.

FIG. 3 illustrates one example of such organic electroluminescence devices. The organic electroluminescence device comprises an anode 1, a cathode 2, an intermediate layer 3, a plurality of light emitting layers 4a,4b and a transparent substrate 5. The light emitting layer 4a,4b are disposed between the anode and the cathode. The intermediate layer 3 is interposed between the light emitting layers 4a,4b. The anode 1, the cathode 2, the intermediate layer 3 and the light emitting layers 4a,4b are laminated to a surface of the transparent substrate 5. The anode 1 is formed of a light transmissive material. The cathode 2 is formed of a light reflective material. The device is provided at both sides of the light emitting layer 4a,4b with an electron injection layer and a hole transport layer, which are not illustrated in FIG. 3.

In this device, the plural light emitting layers 4a,4b are separated from each other with the intermediate layer 3 interposed therebetween, but electrically connected to each other. In response to an electric voltage applied between the anode 1 and the cathode 2, the light emitting layers 4a,4b are stimulated to simultaneously radiate lights just like series-connected light emitting layers, giving a luminous light with a higher brightness by combination of the lights radiated from 4a,4b, compared to conventional organic electroluminescence devices. Besides, this device enables it to overcome the problems arising from the trade-off relationship between brightness and durability mentioned above.

As configurations of the intermediate layer 3, there are generally known configurations, such as (1) BCP:Cs/$V_2O_5$, (2) BCP:Cs/NPD:$V_2O_5$, (3) a product of reaction between an Li complex and Al, (4) Alq:Li/ITO/hole transport material, (5) a metal-organic mixture layer, (6) an alkali metal oxide or an alkali earth metal oxide. Herein, symbols ":" and "/" denote a mixture of two materials and a laminate of two compositions, respectively.

Other configurations of the intermediate layer 3 have been disclosed in patent reference 6 and non-patent reference 1. The intermediate layers 3 in these references are respectively formed of (7) a laminate including an electron injection layer, an electron extraction layer and an hole transport material layer, and (8) a laminate including an electron injection layer, an electron transport layer, an electron extraction layer and a hole transport layer.

REFERENCES

Patent References

Patent reference 1: JP11-329748 patent application publication

Patent reference 2: JP2003-272860 patent application publication

Patent reference 3: JP2005-135600 patent application publication

Patent reference 4: JP2006-332048 patent application publication

Patent reference 5: JP2006-173550 patent application publication

Patent reference 6: JP2006-49393 patent application publication

Non-Patent References

Non-patent reference 1: Japanese Journal of Applied Physics, Vol. 45, No. 12, 2006, pp. 9212.

SUMMARY OF THE INVENTION

Technical Problem

However, the conventional composition in which the intermediate layer is interposed between the light emitting layers suffers from an excessive increase in a driving voltage and an undue increase in a voltage as well as adverse effects such as a short-circuit due to its degenerated film quality.

The intermediate layer in the above configuration (1) may suffer from a short-circuited problem arising from a quality of $V_2O_5$ layer.

The intermediate layer in the above configuration (2) suffers from an excessive increase in an electric voltage due to a minor reaction between two layers. Namely, this intermediate layer suffers from an excessive increase in a driving voltage which arises from a reaction between a Lewis acid molecule and an electron transport material as well as a reaction between an alkali metal serving as a Lewis base and a hole transport material, as reported in "The society of polymer science, organic EL research meeting dated Dec. 9, 2005, multi-photon organic EL luminaire".

The intermediate layer in the above configuration (3) may suffer from adverse effects on device itself brought by an organic ligand component of Li complex.

In the above configuration (4), ITO insufficiently acts as the intermediate layer for injecting holes into the hole transport material, possibly causing problems in terms of the driving voltage and the device quality. Besides, ITO has a small relative resistance, possibly conveying charges into undesired portions so as to cause light emission at undesired regions.

The intermediate layer in the above configuration (5) is prepared by mixing a metal (or a metal compound such as a metal oxide) with an organic material. Such an intermediate layer suffers from a degeneration of thermal stability, especially when being heated due to a large electric current flowing therethrough.

The intermediate layer in the above configuration (6) is formed of an alkali metal oxide or an alkali earth metal oxide. But, the metal oxide insufficiently serves as the intermediate layer. Thereby, this intermediate layer needs to be provided with additional substances other than the metal oxide, so as to have a complicated configuration.

Besides, the intermediate layers in the above configurations (1) and (4) may suffer from excessive pressures therein, when being employed to form large-dimensional devices. The excessive pressure may bring adverse effects in the vicinity of the intermediate layer.

In patent reference 3, an additive agent is added into one matrix to have a concentration more than zero in any location within the intermediate layer. However, such an intermediate layer does not overcome all problems mentioned in the above references.

The configuration (7) suffers from an excessive driving voltage stated in non-patent reference 1. The intermediate layer in the configuration (8) can overcome problems arising from the excessive voltage in (7), but does not overcome problems in terms of durability arising from diffusion and reaction in the electron injection layer and the electron extraction layer which are respectively disposed in both sides of the electron transport layer.

As described above, there are various problems to form an electroluminescence device having the plural light emitting layer with the intermediate layer being interposed between the light emitting layers. At present, the intermediate layer needs to be improved for overcoming the above problems in fabrication of such an electroluminescence device.

The present invention has been accomplished in view of the above problem, and has an object to provide an organic electroluminescence device with superior durability and sustainability, as well as a method of fabricating the same.

Solution to Problem

An organic electroluminescence device of the present invention comprises an anode 1, a cathode 2, an intermediate layer 3, and a plurality of light emitting layers 4. The plural light emitting layers 4 are disposed between the anode 1 and the cathode 2. The intermediate layer 3 is disposed between the light emitting layers 4. The intermediate layer 3 comprises a layer 3a, a light transmissive layer containing an electrically conductive material 3b, a charge transport organic material layer 3c and a hole injection material layer 3d, which are superimposed in this order. The layer 3a is one of a charge transfer complex layer made of a charge transfer complex, a metal layer made of a metal having a work function of 3.7 eV or less, and a metal compound layer made of a compound of a metal having a work function of 3.7 eV or less. The charge transport organic material layer 3c is formed of a charge transport organic material. The hole injection material layer 3d is formed of a hole injection material. The charge transport organic material layer 3c is formed to have a thickness in a range of 0.5 nm to 30 nm.

According to the present invention, the layer 3a and the hole injection material layer 3d are interposed between the electrically conductive material-containing light transmissive layer 3b and the charge transport organic material layer 3c, within the intermediate layer 3, wherein the layer 3a is one of the charge transfer complex layer, the metal layer made of the metal having the work function of 3.7 eV or less, and the metal compound layer made of the compound of the metal having the work function of 3.7 eV or less. With this configuration, the electroluminescence device enables it to prevent the layer 3a from directly reacting with the hole injection material 3d and to inhibit a mixing of the layers 3a,3d at an interlace therebetween as well as a diffusion of materials forming the layers 3a,3d, while driving. Thereby, it is possible to provide an organic electroluminescence device with superior durability and sustainability.

The present invention is characterized in that the charge transport organic material layer 3c is formed of an electron transport material.

The charge transport organic material layer 3c made of the electron transport material enables it to efficiently transport electrons supplied from the hole injection material layer 3d, into the electrically conductive material-containing light transmissive layer 3b at a low resistance. Thereby it is possible to provide an organic electroluminescence device with superior durability and sustainability.

The present invention is characterized in that the charge transport organic material layer 3c is made of a hole transport material.

The charge transport organic material layer 3c made of the hole transport material enables it to efficiently transport holes supplied from the electrically conductive material-containing light transmissive layer 3b, into the hole injection material layer 3d at a low resistance. Thereby it is possible to provide an organic electroluminescence device with superior durability and sustainability.

The present invention is characterized in that the charge transport organic material layer 3c is formed of either one of a bipolar material and a mixture of the hole transport material and the electron transport material.

According to this invention, the charge transport organic material layer 3c serves to transport both of holes and electrons. That is, the charge transport organic material layer 3c enables it to efficiently transport electrons supplied from the hole injection material layer 3d, into the electrically conductive material-containing light transmissive layer 3b at a low resistance. As well, the charge transport organic material layer 3c enables it to efficiently transport holes supplied from the electrically conductive material-containing light transmissive layer 3b, into the hole injection material layer 3d at a low resistance. Thereby, it is possible to provide an organic electroluminescence device with superior high durability and sustainability.

The present invention is characterized in that the electrically conductive material-containing light transmissive layer 3b is formed of a layer selected from a group consisting of a layer made of at least one of a metal oxide and a metal nitride; a laminate layer which is formed of a laminate containing a metal layer made of a metal and a metal oxide layer made of a metal oxide; a mixture layer made of a mixture of a metal and a metal oxide; and a metal layer made of a metal.

According to the present invention, it is possible to form the electrically conductive material-containing light transmissive layer 3b as a stable layer with a highly thermal resistance. In addition, the electroluminescence device enables it to further prevent the layer 3a from directly reacting with the hole injection material 3d and to further inhibit a mixing of the layers 3a,3d at an interface therebetween as well as a diffusion of materials forming the layers 3a,3d arising from a drive of the device. Thereby, it is further possible to provide an organic electroluminescence device with superior durability and sustainability.

The present invention is characterized in that the electrically conductive material-containing light transmissive layer 3b is formed to exhibit a light transmission of 80% or more.

According to the present invention, the electrically conductive material-containing light transmissive layer 3b enables it to reduce light absorption for decreasing a loss of light absorption within the organic electroluminescence device. Thereby, it is possible to provide an organic electroluminescence device with superior durability and sustainability.

The present invention is characterized in that the hole injection material layer 3d is formed of either one of a p-dope layer and an acceptor material layer made of an acceptor material.

According to this invention, the device makes it possible to improve a hole injection performance for transporting holes injected from the hole injection material layer 3d, into the hole transport layer which is adjacent to the hole injection material layer 3d on a side of the cathode 2. In addition, the device makes it possible to decrease a resistance required to transport charges between the hole injection material layer 3d and the charge transport organic material layer 3c which is adjacent to the hole injection material layer 3d on a side of the anode 1. Thereby, this device enables it to suppress a heat generation at an interference between the hole injection material layer 3d and the charge transport organic material layer 3c. Accordingly, the present invention enables it to provide an organic electroluminescence device with superior durability and sustainability.

Advantageous Effects of Invention

In the intermediate layer 3 of the present invention, the electrically conductive material-containing light transmissive layer 3b and the charge transport organic material layer 3c having a thickness of 0.5 nm to 30 nm are interposed between the layer 3a and the hole injection layer 3d. The layer 3a is one of the charge transfer complex layer; the metal layer made of a metal having a work function of 3.7 eV or less; and the metal compound layer made of a compound the metal having the work function of 3.7 eV or less. The intermediate layer 3 is allowed to be free from a direct reaction between the layers 3a,3d, a mixing of the layers 3a,3d at the interface therebetween, and the diffusion of materials forming the layers 3a,3d. With the improved intermediate layer, the organic electroluminescence device makes it possible to exhibit superior durability and sustainability.

DETAILED DESCRIPTION OF THE INVENTION

Hereafter, explanations are given as to detailed description of the present invention.

Figure 1:
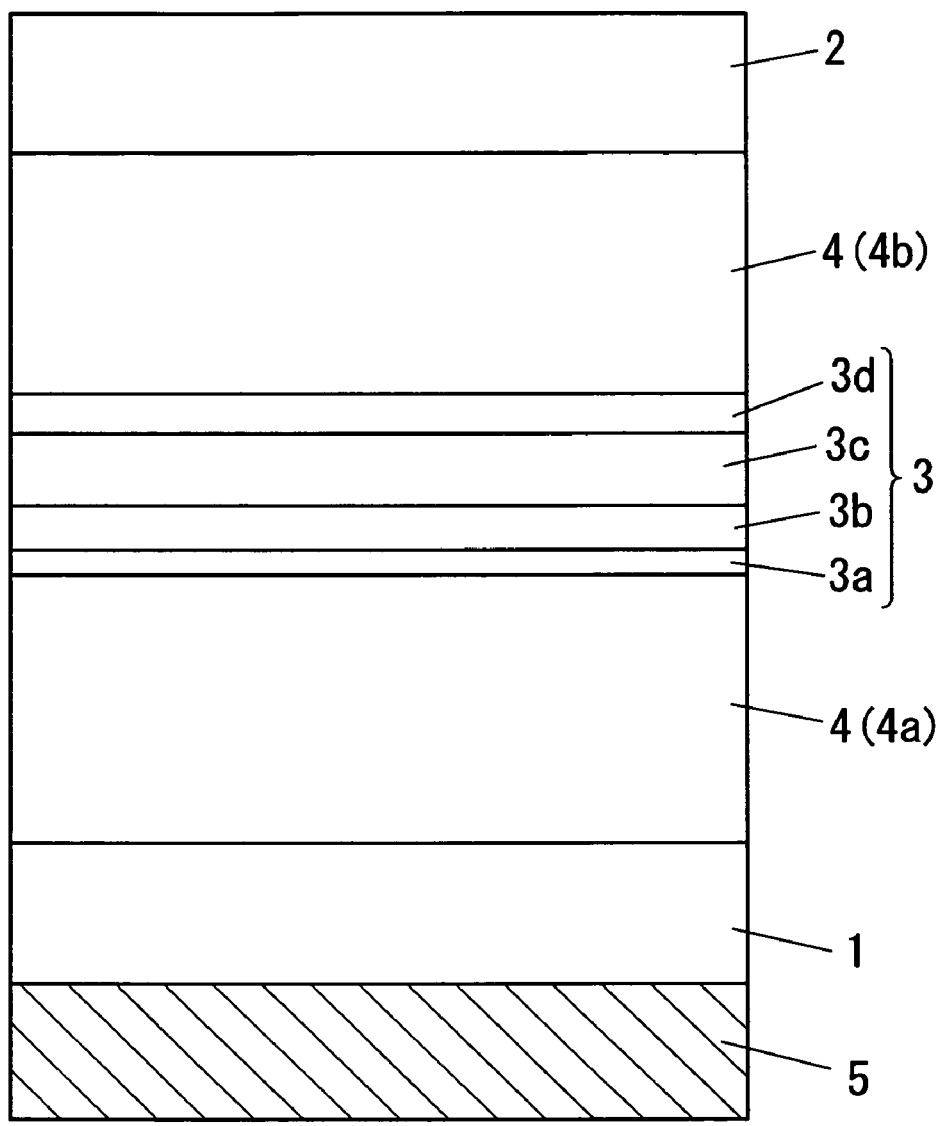
FIG. 1 illustrates a schematic sectional view of a layer configuration in accordance with one example of an embodiment of the present invention.

FIG. 1 illustrates one example of configurations of organic electroluminescence devices of the present invention, which comprises an anode 1, a cathode 2, a light emitting layer (an organic light emitting layer) 4, and an intermediate layer 3. Both of the light emitting layer 4 and the intermediate layer 3 are disposed between the anode 1 and the cathode 2. The light emitting layer 4 is composed of a plurality of light emitting layers 4a,4b. The plural light emitting layers 4a,4b are disposed between the anode 1 and the cathode 2. The intermediate layer 3 is disposed between adjacent ones of the plural light emitting layers 4a,4b. One of the electrodes (the anode 1) is laminated on a surface of a transparent substrate 5. In one embodiment shown in FIG. 1, the anode 1 is formed as a light transmissive electrode. The cathode 2 is formed as a light reflective electrode.

The light emitting layer 4 is composed of two light emitting layers 4a,4b with the intermediate layer 3 being interposed therebetween in the embodiment shown in FIG. 1. But, the light emitting layer 4 may be formed of multiple light emitting layers with the intermediate layers each interposed between adjacent ones of the multiple light emitting layers. The number of superimposed light emitting layers is not limited to a particular number, but preferably set to be five or less in view of the difficulty in optical and electrical device design increasing with the number of superimposed layers. The organic electroluminescence device of the present invention may be provided with a hole injection layer, a hole transport layer, an electron transport layer, an electron injection layer, and so on, just like conventional organic electroluminescence devices. These layers are not shown in FIG. 1.

As shown in FIG. 1, the intermediate layer 3 of the present invention is formed of one layer 3a, a light transmissive layer containing an electrically conductive material 3b, a charge transport organic material layer 3c, and a charge injection material layer 3d, which are superimposed in this order to the anode 1, prior to formation of the cathode 2. The layer 3a is formed of one of a charge transfer complex layer made of a charge transfer complex, a metal layer made of a metal having a work function of 3.7 eV or less, and a metal compound layer made of a compound of a metal having a work function of 3.7 eV or less.

In the present invention, the layer 3a is formed of one of the charge transfer complex layer, the metal layer made of the metal having the work function of 3.7 eV or less, and the metal compound layer made of the compound of the metal having the work function of 3.7 eV or less. The layer 3a serves to facilitate the injection of electron charges supplied from the intermediate layer 3 into one of the light emitting layers 4 (4a) adjacent to the anode 1.

The charge transfer complex layer 3a is formed of a material which is generally known as a charge transfer complex system contributing to the electron injection. The material of the charge transfer complex layer 3a is not required to be formed of a particular one. For example, the charge transfer complex layer 3a can be formed of a mixture of an electron transport material and a metal having a small work function (in particular, a metal having a work function of 3.7 eV or less) such as Ce, Li, Na, Mg, K, Rb, Sm, Y. Instead, the charge transfer complex layer 3a can be formed of a mixture of an electron transport material and an organic material (or inorganic material) which has an energy level suitable to supply electrons into the electron transport material. For example, an organic material (e.g., an Ru complex) generally known as an organic donor, the metal having the work function of 3.7 eV or less, or a metal oxide semiconductor containing the above metal may be employed as the organic material (or inorganic material) having an energy level suitable to supply electrons into the electron transport material.

The charge transfer complex layer 3a may be formed by superimposing a metal film made of a reductive metal (e.g., Al), on a laminate or a mixture of an electron transport material and a compound of a reductive metal having a small work function. The reductive metal having a small work function is not limited to a particular one. The reductive metal compound may be a metal oxide, a metal-organic complex, in which the metal may be an alkali metal, an alkali earth metal or a rare earth metal (e.g., Li, Cs, Na, Sr, Mg, Ca, Y, Sm). The reductive metal compound may be one of the above-listed substances or a mixture thereof.

The metal layer 3a made of the metal having the work function of 3.7 eV or less is not required to be formed of a particular metal, but can be formed of one selected from a group consisting of alkali metals, alkali earth metals and rare earth metals including the above-listed metals. The metal compound layer is not required to be formed of a particular compound, but may be formed of one selected from oxides, halides, nitrides, borides, carbides, oxynitrides, or composite compounds of the above metals.

The charge transfer complex layer 3a, the metal layer made of the metal having the work function of 3.7 eV or less, or the metal compound layer 3a made of the compound the metal having the work function of 3.7 eV or less is not required to have a particular thickness, but preferably formed to have a thickness in a range of 0.5 nm to 20 nm. The layer 3a may contain another organic compound, or an inorganic substance such as a metal (e.g., Al, Cu, Ni, Ag, Au and Ti), a metal halide (e.g., LiF, NaF and CsF), and a metal oxide (e.g., $Li_2O$, $SiO_2$, SiO, NiO, SnO and InO). When containing two or more substances, the layer 3a enables it to further improve stabilities of poorly stable substances and to facilitate film formations of materials having low qualities and poor adhesions to adjacent layers.

The electrically conductive material-containing light transmissive layer 3b is formed of a well-known electrically conductive material with a high light transmission and a suitable thickness, and is not required to be made of a particular compound. The electrically conductive material-containing light transmissive layer 3b can be formed of one substance suitably selected from conventional electrically conductive materials, such as metals, metal oxides, metal nitrides, electrically conductive compounds, and so on. For example, the electrically conductive material-containing light transmissive layer 3b may be formed of a metal (e.g., Al, Cu, Ni, Ag, Au, Ti, Mg, Ca and Ba), a metal compound (e.g., CuI, ZnSe, ZnS and CuSe), a metal oxide (e.g., ITO(In/Sn oxide), $SnO_2$, ZnO, IZO(In/Zn oxide), $LiWO_4$ and $LiMoO_2$), a metal nitride (e.g., TiN, SiN and AlN) or a carbon compound (e.g., carbon nanotube, fullerene). Instead, the electrically conductive material-containing light transmissive layer 3b may be formed of a mixture of a metal oxide and a metal nitride (e.g., a $SiO_2$/SiN mixture, a $SiON/TiO_2$/TiN mixture and TiON).

The electrically conductive material-containing light transmissive layer 3b is not required to be formed of only one substance. The electrically conductive material-containing light transmissive layer 3b may be formed of a combination of plural metals listed above (e.g., In/Sn, In/Zn, Al/Ga, Ga/Zn and Ti/Nb), a combination of the metal oxide and the metal nitride, or another combination. Instead, the electrically conductive material-containing light transmissive layer 3b may be formed of a metal/metal oxide mixture (e.g., IZO/Mo mixture and ITO/W mixture), a metal/metal oxide laminate (e.g., Al/IZO laminate), a metal/metal nitride mixture (e.g., SiN/Al mixture and TiN/Mo mixture) or a metal/metal nitride laminate (e.g., SiN/Al laminate and TiN/Mo laminate). It is possible to suitably set an oxidation number of each metal, a nitridation number of each metal and a mixing ratio of the plural metals, depending on a film quality, a thermal stability and an electrical performance (preferably low resistance less than $10^5$ ohms cm, more preferably less than $10^2$ ohms cm) of an oxide (or nitride) of the metal. Each of these substances can be deposited to form a film as a layer by a vacuum vapor deposition, a spattering, an application or the like.

The electrically conductive material-containing light transmissive layer 3b may further contain organic compounds and non-electrically conductive inorganic insulators besides the above electrically conductive materials. The inorganic insulator is suitably selected to be co-deposited into a film together with the electrically conductive metal oxide, and not required to be formed of a particular compound. For example, the inorganic insulator may be one selected from metal halides such as metal fluorides (e.g., lithium fluoride, magnesium fluoride) metal chlorides (e.g., sodium chloride, magnesium chloride). Instead, the inorganic insulator may be one selected from metal oxides (e.g., $Al_2O_3$, MgO and iron oxide, except metal oxides exhibiting hole injecting performances) of a metal such as Al, Co, Zr, Ti, V, Nb, Cr, Ta, W, Mn, Mo, Ru, Fe, Ni, Cu, Ga and Zn. Instead, the inorganic insulator may be one selected from nitrides (e.g., AlN, SiN or BN), carbides (e.g., SiC), oxynitrides (e.g., SiON), silicon compounds (e.g., $SiO_2$ and SiO) and carbon compounds.

The insulator is preferably selected from materials each exhibiting a poor absorbance in a visible-light region and a low refractive index, for the purpose of reducing the light absorbance and the refractive index at the light transmissive layer 3b and eventually suppressing light reflection and light absorbance within the device itself. Thereby, it is possible to minimize a loss in amount of light emitted outward from the light emitting layer 4. In particular, the insulator is preferably one material selected from non-electrically conductive metal oxides, metal halides, metal nitrides, metal carbides, carbon compounds, silicon compounds, in view of heat-resistance, stability and optical properties. When the light transmissive layer 3b is formed of such a mixture, mixing ratio thereof is suitably selected to exhibit a relative resistance of $1 \times 10^5$ ohms cm or less at the light transmissive layer 3b.

The electrically conductive material-containing light transmissive layer 3b may further contain a metal or a compound of the metal. The metal may be preferably one selected from Ce, Cs, Li, Na, Mg, K, Rb, Sm, Y, W, Mo, Re, V, Ru, Al and so on. The metal compound is preferably formed of a compound of one of these metals. The metal content can be suitably selected to exhibit a relative resistance in the above range at the light transmissive layer 3b, and is not required to be a particular range. But, the metal content is preferably in a range of 0.1-20% by weight.

The electrically conductive material-containing light transmissive layer 3b exhibiting a relative resistance of $1 \times 10^5$ ohms cm or less is preferably formed to have a thickness of 10 nm or less, more preferably a thickness of 5 nm or less. When the light transmissive layer 3b is formed to have a thickness of 10 nm or less, it is possible to reduce an electrical conduction in a lateral direction at the light transmissive layer 3b to a negligible level, and eventually to suppress a light transmission in an undesired region which is not suppressed in conventional devices. The thickness (nm) of the electrically conductive material-containing light transmissive layer 3b is preferably selected to give a quotient of $10^4$ or less when divided by the relative resistance (ohms cm).

The electrically conductive material-containing light transmissive layer 3b is preferably formed to have a light transmission of 80% or more, more preferably 90% or more. When being formed to have a light transmission below 80%, the light transmissive layer 3b is caused to absorb light excessively, leading to a decrease in amount of extracted light among light emitted from the light emitting layer 4. Herein, the light transmission of the layer 3b is determined based on a substantial light transmission of the layer 3b, and not based on the light reflected at an interface between the layer 3b and a layer adjacent to the layer 3b due to a refractive index difference therebetween. The substantial light transmission can be obtained through a measurement by means of a conventional method, and easily determined based on a difference between light transmissions of films having different thicknesses each formed on a light transmissive substrate such as a glass substrate.

The charge transport organic material layer 3c formed of a charge transport organic material serves to transport charges, i.e., electrons and holes. The charge transport organic material layer 3c can be formed as an electron transport material layer made of an electron transport material, a hole transport material layer made of a hole transport material, a mixture of the hole transport material and the electron transport material, or a layer made of a bipolar material.

When being made of the electron transport material, the charge transport organic material layer 3c serves to effectively transport electrons injected from the hole injection material layer 3d which is adjacent to the layer 3c on the cathode 2 side, into the electrically conductive material-containing light transmissive layer 3b which is adjacent to the layer 3c on the anode 1 side, with a low resistance. The electron transport material can be suitably selected to exhibit a superior electron transport performance and a superior thermal stability as well as a good stability to electrons. The electron transport material is not required to be a particular compound, and may be a quinoline derivative such as Alq, a triazole derivative, a phenanthroline derivative, a pyridine derivative, for example.

When being made of the hole transport material, the charge transport organic material layer 3c serves to effectively transport holes injected from the electrically conductive materials-containing light transmissive layer 3b which is adjacent to the layer 3c on the anode 1 side, into the hole injection material layer 3d which is adjacent to the layer 3c on the cathode 2 side, with a low resistance. The hole transport material can be suitably selected to exhibit a superior hole transport performance and a superior thermal stability as well as a good stability to holes. The hole transport material is not required to be a particular compound, and may be a triarylamine derivative (NPD, TPD, 2-TNATA and so on), an aromatic derivative (a biphenyl derivative, an anthracene derivative, a naphthalene derivative and so on), an aniline derivative, a thiophene derivative, or the like.

When being made of a mixture of the hole transport material and the electron transport material, the charge transport organic material layer 3c can be formed of a mixture of one of the hole transport materials listed above and one of the electron transport materials listed above. Instead, the charge transport organic material layer 3c can be made of a bipolar material. The bipolar material is suitably selected to exhibit both a hole-transporting performance and an electron-transporting performance, and may be one of anthracene derivatives, polycyclic aromatic substances and the like. The bipolar material is preferably selected to exhibit superior performances for transporting both holes and electrons as well as a superior thermal stability.

When being formed of either one of the bipolar material and the mixture of the hole transport material and the electron transport material, the charge transport organic material layer 3c serves to transport both holes and electrons. Namely, the charge transport organic material layer 3c serves to transport electrons injected from the hole injection material layer 3d, into the electrically conductive material-containing light transmissive layer 3b effectively with a low resistance. As well, the charge transport organic material layer 3c serves to transport holes injected from the electrically conductive material-containing light transmissive layer 3b, into the hole injection material layer 3d effectively with a low resistance. In particular, as being formed of either one of the bipolar material or the mixture of the hole transport material and the electron transport material, the charge transport organic material layer 3c is prevented from being degraded when invaded by counter charges, whereby achieving an organic electroluminescence device with superior stability and superior durability.

The charge transport organic material layer 3c is formed to have a thickness in a range of 0.5 nm to 30 nm, preferably 1 nm to 10 nm. When the charge transport organic material layer 3c is formed to have a thickness below 0.5 nm, the light transmissive layer 3b is caused to come into contact with the hole injection material layer 3d. In this case, it is impossible to avoid a substance diffusion possibly leading to a decline in driving performance. When being formed to have a thickness more than 30 nm, the charge transport material layer 3c is caused to exhibit a poor durability as well as a poor performance resulting from instability in its charge-transporting performance.

In the present invention, the hole injection material layer 3d can be formed of a hole injection organic material, a hole injection metal oxide, an acceptor-type organic (or inorganic) material, a p-dope layer or the like.

The hole injection organic material is selected to exhibit a hole-transporting performance and have a work function in a range of ca. 5.0 eV to 6.0 eV as well as a strong adhesion to electrodes. For example, the hole injection organic material may be CuPc, a starburst amine or the like. The hole injection metal oxide may be an oxide of a metal which is selected from Mo, Re, W, V, Zn, In, Sn, Ga, Ti and Al. The hole injection metal oxide is not required to be only one metal oxide, but may be a combination of oxides of plural metals. The plural metals may be a combination of the substances listed above, such as a combination of In/Sn, In/Zn, Al/Ga, Ga/Zn and Ti/Nb. An oxidation number of each metal and a mixing ratio of the plural metals can be suitably selected to exhibit a preferable film quality, a preferable thermal stability and a preferable electrical performance. The hole injection material layer 3d may be formed of almost the same material as the electrically conductive material-containing light transmissive layer 3b.

The acceptor-type organic (or inorganic) material is selected to exhibit an electron-accepting performance for accepting electrons which are supplied from other organic (inorganic) materials. Such organic (inorganic) materials are either included in a layer adjacent to the layer 3d or mixed into the layer 3d. The acceptor-type organic (or inorganic) material may be an organic substance having a fluorine substituent, a cyano group, a boron substituent or a substituent serving as a Lewis acid. Instead, the acceptor-type organic (or inorganic) material may be an organic substance interacting with a Lewis acid to form a complex. For example, the acceptor-type organic (or inorganic) material may be one which is selected from $F_4TCNQ$, TCNQ, TTN, HAT-$CN_6$, DDQ, $CF_2TCNQ$, TBPAH, some of phosphor pigments, and the like. There are well-known abbreviations among these substances. The acceptor-type organic (or inorganic) material can be suitably selected to exhibit the same properties as the above-listed substances, and is not required to be a particular one. The acceptor-type organic (or inorganic) material may be one selected from the above metal oxides, Lewis acids such as an iron chloride, iron bromide, copper iodide, halogens (e.g., Br and Cl), acids (e.g., phosphoric acid) and the like.

The acceptor-type organic (or inorganic) material is not required to be selected to exhibit a charge-donating/accepting performance in the absence of the electric voltage applied to the layer 3d for donating and accepting electrons to/from other organic (inorganic) materials which are either included in a layer adjacent to the layer 3d or mixed into the layer 3d. That is, the acceptor-type organic (or inorganic) material can be selected to exhibit a charge-donating/accepting performance in the presence of the electric voltage applied to the layer 3d for donating and accepting electrons to/from other organic (inorganic) materials which are either included in a layer adjacent to the layer 3d or mixed into the layer 3d. Among the above-listed substances, TCNQ, HAT-CN6 and some of phosphor pigments each having a low content of electron-accepting group exhibits a poor electron-accepting performance. The charge-donating/accepting performance can be confirmed by comparison of an absorption spectrum (or a raman spectrum) of a film containing two materials with a superposition of absorption spectra (or raman spectra) of the two materials. When exhibiting the charge-donating/accepting performance, the film containing two materials gives an absorption spectrum (or a raman spectrum) in which appearance of new peaks, disappearance of some peaks and variations in intensities of some peaks are observed. When not exhibiting the charge-donating/accepting performance, the film containing two materials gives almost the same absorption spectrum (or raman spectrum) as a superposition of absorption spectra (or raman spectra) of the two materials.

The p-dope layer is formed of a mixture of a hole injection material and the electron-accepting material which accepts electrons from the hole injection material. The hole injection material may be replaced with an organic material such as triarylamine derivative (NPD, TPD, 2-TNATA and the like), an aromatic derivative (e.g., a biphenyl derivative, an anthracene derivative, a naphthalene derivative), an aniline derivative, a thiophene derivative. The content ratio of the electron-accepting material to the hole injection material can be suitably set depending on the selected materials, and is preferably selected to be 0.1-80 mol %, more preferably 1-50 mol %.

The hole injection material layer 3d is not required to have a particular thickness, but is preferably set to have a thickness in a range of 0.5-20 nm.

The process of preparing the intermediate layer 3 including the above layers 3a,3b,3c,3d is initiated by forming the charge transfer complex layer 3a made of the charge transfer complex, the metal layer 3a made of the metal having the work function of 3.7 eV or less, or the metal compound layer made of the compound of the metal having the work function of 3.7 eV or less, on one of the light emitting layers. Then, the electrically conductive material-containing light transmissive layer 3b is laminated on a surface of the preceding layer 3a. Next, the hole transport organic material layer 3c made of the hole transport organic material is laminated on a surface of the electrically conductive material-containing light transmissive layer 3b. The hole injection material layer 3d made of the hole injection material is laminated on a surface of hole transport organic material layer 3c. PVD method (e.g., vapor deposition method and spattering method), application or other methods can be employed to form a film as each layer 3a,3b,3c,3d. One of the light emitting layer 4 may be provided at its surface with an electron transport layer. In this case, the intermediate layer 3 composed of the layers 3a,3b, 3c,3d is provided to the light emitting layer 4 with the electron transport layer being interposed therebetween.

The light emitting layer 4 of the present invention can be formed of any of well-known materials for fabrication of an electroluminescence device, such as anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, a quinoline-metal complex, a tris(8-hydroxyquinolinate)aluminum complex, a tris(4-methyl-8-quinolinate)aluminum complex, a tris(5-phenyl-8-quinolinate)aluminum complex, an aminoquinoline-metal complex, a benzoquinoline-metal complex, a tri-(p-terphenyl-4-yl) amine, 1-aryl-2,5-di(2-thienyl)pyrrole derivative, pyrane, quinacridone, rubrene, a distyrylbenzene derivative, a distyrylarylene derivative, a distyrylamine derivative, or various phosphor pigments as well as the above-listed materials and their derivatives. The light emitting layer 4 is not required to be formed of the above substance. The light emitting layer 4 is preferably formed of a mixture of luminescent materials selected among these substances. The light emitting layer 4 may be formed of one of other luminescent materials causing photoemission from spin-multiplets, such as phosphorescent materials and compounds having phosphorescent moieties, instead of fluorescent compounds listed above. Each of the organic layers formed of the above material can be formed by a dry-type process (e.g., vapor deposition and transferring) or a wet-type process (e.g., spin-coating, spray-coating, diecoating and gravure printing).

Other components, namely the substrate 5, the anode 1 and the cathode 2 are respectively formed of conventional materials, to form an organic electroluminescence device.

The substrate 5 serves to exhibit a light transmissive performance for light passing therethrough, and may be formed of non-colored transparent glass, a subtly colored glass or a frosted glass. The substrate 5 may be formed of a transparent glass (e.g., a soda lime glass, a non-alkali glass), and a plastic film (or plastic plate) which is prepared by an arbitrary method from a resin (e.g., a polyester resin, a polyolefin resin, a polyamide resin, an epoxy resin and a fluorine resin). The substrate 5 may contain particles (powders, bubbles or the like) having refractive indexes different from that of the substrate 5 or may be formed at its surface with an arbitral shape, for causing light diffusion effects. When the device is not configured to radiate light through the substrate 5, the substrate 5 is not required to be formed of a light transmissive material but may be formed of other material in consideration of a light emission performance and a durability of the device and the like. In particular, the substrate 5 may be formed of a highly thermal conductive material for minimizing heat generation arising from an electricity passing through the device.

The anode 1 is designed to inject holes into the organic light emitting layers 4, and preferably formed of a metal having a large work function (4 eV or more), an alloy, an electrically conductive compound, and an electrode material formed of a mixture of these substances. The anode 1 may be formed of a metal (e.g., Au), CuI, ITO (In—Sn oxide), $SnO_2$, ZnO, IZO (In—Zn oxide), PEDOT, an electrically conductive polymer (e.g., polyaniline), an electrically conductive material doped with an acceptor material (or the like), an electrically conductive light transmissive material (e.g., carbon nanotube). The anode 1 can be formed as a film on a surface of the substrate 5 by a vacuum vapor deposition method, a patterning method, an application, or the like. When the device is configured such that the light emitted from the organic light emitting layers 4 is directed outwards through the anode 1, the anode 1 is preferably formed to have a light transmission of 70% or more. In addition, the anode 1 is preferably formed to have a sheet resistance of several hundreds ohms per square or less, more preferably 100 ohms per square or less. The anode 1 can be controlled to have a suitable thickness depending on selected material for achieving its light transmission and its sheet resistance mentioned above, and is preferably formed to have a thickness of 500 nm or less, more preferably in a range of 10-200 nm.

The cathode 2 is designed to inject electrons into the organic light emitting layers 4, and is preferably formed of a metal having a low work function (preferably, 5 eV or less), an alloy, an electrically conductive compound, or an electrode material formed of a mixture of these materials. The cathode 2 may be formed of an alkali metal, an alkali metal halide, an alkali metal oxide, an alkali earth metal, an alloy formed of any of these metals and another metal (e.g, Na, Na—K alloy, Li, Mg, Mg—Ag mixture, Mg—In mixture, Al—Li mixture, Al/LiF mixture), Al, Al/$Al_2O_3$ mixture. The cathode 2 may be formed as a laminate which contains a bottom layer made of an alkali metal oxide (an alkali metal halide or a metal oxide), and one or more upper layers made of electrically conductive materials such as metals. For example, the cathode 2 may be formed as an alkali metal/Al laminate, an alkali metal halide/an alkali earth metal/Al laminate, an alkali metal oxide/Al laminate. The cathode 2 may be formed of a transparent electrode such as ITO and IZO, for passing light therethrough. The organic material layer adjacent to the cathode 2 may be doped with an alkali metal (e.g., Li, Na, Cs) or an alkali earth metal (e.g., Ca).

The cathode 2 can be prepared as a film made of these electrode materials by vacuum vapor deposition method or spattering method. When the device is configured such that the light emitted from the organic light emitting layers 4 is propagated outward through the anode 1, the cathode 2 is preferably formed to have a light transmission of 10% or less. Alternatively, when the cathode 2 is formed of the transparent electrode for propagating therethrough the light emitted from the organic light emitting layers 4 (or for propagating the light emitted from the organic light emitting layers 4, through both of the anode 1 and the cathode 2), the cathode 2 is preferably formed to have a light transmission of 70% or more. In this case, the cathode 2 is suitably controlled depending on selected materials to have a desirable light transmission performance, and preferably controlled to have a thickness of 500 nm or less, more preferably in a range of 100-200 nm.

Other configurations may be employed to form the organic electroluminescence device of the present invention, unless extending beyond objects of the present invention. For example, hole injection layers, hole transport layers, electron injection layers, electron transport layers are not shown in FIG. 1, but can be suitably added to form the organic electroluminescence device if necessary.

The hole transport layer may be formed of one selected among compounds exhibiting hole transporting performances. For example, the hole transport layer may be formed of an arylamine compound such as 4,4'-bis[N-(naphthyl)-N-phenyl-amino]biphenyl (alpha-NPD), N,N'-bis(3-methylphenyl)-(1,1'-biphenyl)-4,4'-(TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, TNB. Instead, the hole transport layer may be formed of an amine compound containing a carbazole group, an amine compound containing fluorene derivative. Instead, conventional hole transport materials can be employed to form the hole transport layer.

The electron transport material layer may be formed of one selected among compounds exhibiting electron-transporting performances. Such an electron-transporting compound may be one selected among metal complexes (e.g., $Alq_3$) exhibiting electron-transporting performances, and heterocyclic compounds such as phenanthroline derivatives, pyridine derivatives, tetrazine derivatives, oxadiazole derivatives. Instead, another conventional electron-transporting material can be employed as the electron transport material.

In the organic electroluminescence device fabricated according to the above process, the intermediate layer 3 is provided between the plural light emitting layers 4, whereby making it possible to connect the plural light emitting layers in series for achieving a light emission with a high luminance.

In this embodiment, the intermediate layer 3 contains one of the charge transfer complex layer 3a, the metal layer 3a made of the metal having the work function of 3.7 eV or less, and the metal compound layer 3a made of the compound of the metal having the work function of 3.7 eV or less. The intermediate layer 3 further contains the electrically conductive material-containing light transmissive layer 3b, the charge transport organic material layer 3c, and the hole injection material layer 3d. In this configuration, the layer 3a and the hole injection material layer 3d are separated from each other by the electrically conductive material-containing light transmissive layer 3b and the charge transport organic material layer 3c, whereby being prevented from directly reacting with each other. Besides, the intermediate layer 3 makes it possible to suppress an interlayer mixing or an interlayer diffusion of materials between the layers 3a,3d, whereby achieving an electroluminescence device with superior durability and sustainability.

EXAMPLE

The present invention is specifically described with reference to examples.

Example 1

Figure 2A:
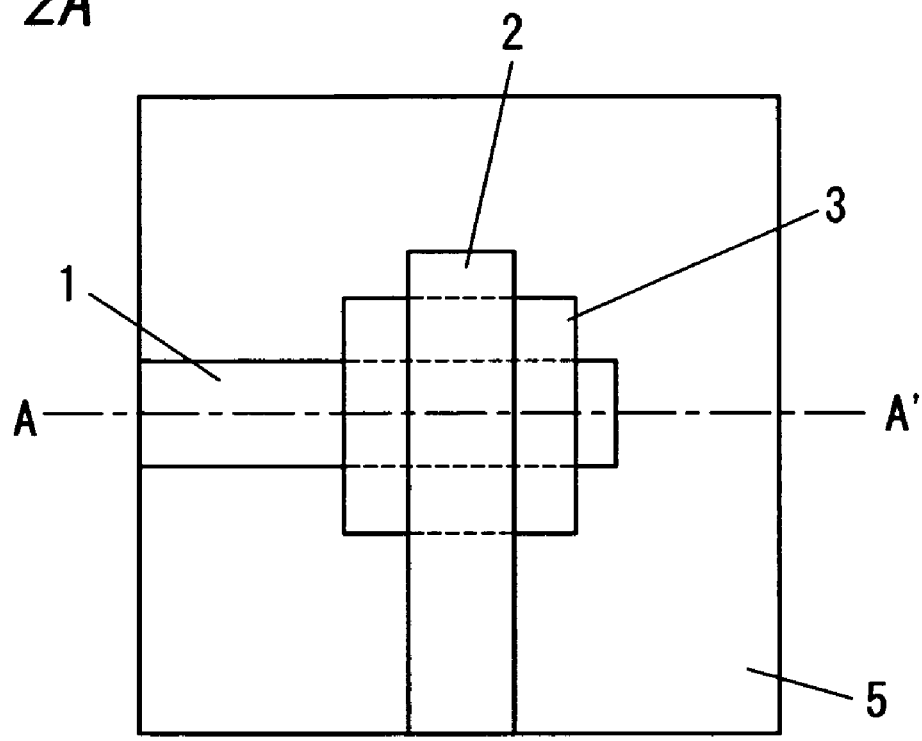
FIG. 2 illustrates (a) a plan view and (b) and a sectional view through a line of A-A' of (a), showing a schematic configuration of an organic electroluminescence device prepared in Example.
Figure 2B:
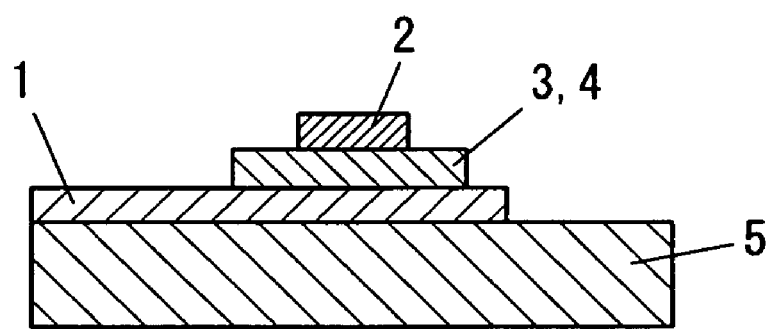
Figure 3:
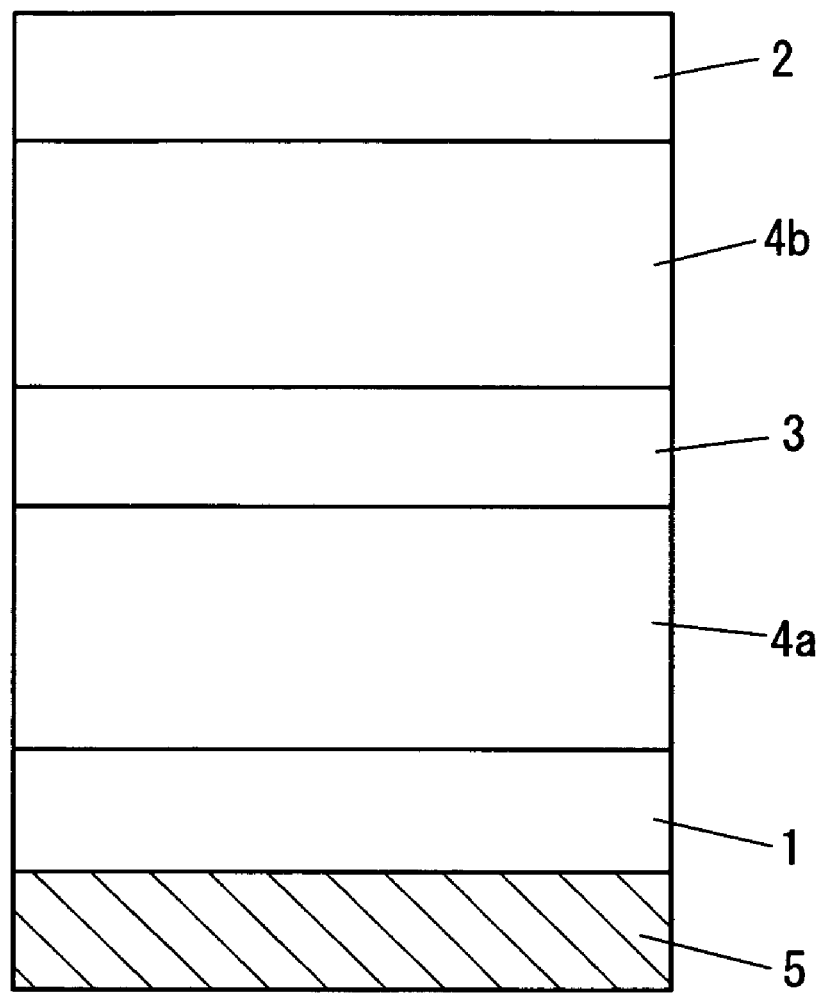
FIG. 3 illustrates a schematic sectional view of a layer configuration of a conventional example.

In preparation of the anode 1, an ITO film was formed into a predetermined pattern shown in FIG. 2. The ITO film has a dimension of 150 nm in thickness and 5 mm in width, and a sheet resistance of ca. 10 ohms per square. A glass substrate having a thickness of 0.7 mm was employed as a substrate 5. The substrate 5 was ultrasonically washed with a detergent for ten minutes, washed with ion-exchange water for ten minutes, and washed with acetone for ten minutes. Then, the washed substrate 5 was vapor-washed with IPA (isopropylalcohol) and dried, and subsequently subjected to UV/$O_3$ treatment.

Next, the substrate 5 was disposed within a vacuum vapor deposition apparatus. Under a decreased pressure of $1 \times 10^{-4}$ Pa or less, 4,4'-bis[N-(naphthyl)-N-phenyl-amino]biphenyl (alpha-NPD) and molybdenum oxide ($MoO_3$) were vapor co-deposited on the anode 1 to form an alpha-NPD/$MoO_3$ film (1:1 molar ratio) having a thickness of 30 nm as a hole injection layer. Then, alpha-NPD was vapor deposited to form an alpha-NPD film having a thickness of 30 nm as a hole transport layer.

Next, Alq$_3$ and quinacridone were vapor co-deposited on the hole transport layer to form an Alq$_3$ layer (containing 3% by weight of quinacridone) having a thickness of 30 nm as a light emitting layer 4a. Subsequently, BCP was deposited on the light emitting layer 4a to form a BCP film having a 60 nm thickness as an electron transport layer.

Next, Alq$_3$ and Li were co-deposited on the electron transport layer to form an Alq$_3$/Li mixture (1:1 molar ratio) film having a thickness of 5 nm as a charge transfer complex layer 3a. The charge transfer complex layer serves as an electron injection layer. Next, Al was deposited on the layer 3a to form an Al film having a 3 nm thickness as an electrically conductive material-containing light transmissive layer 3b. Then, BCP was deposited on the layer 3b to form a BCP film having a 5 nm thickness as a charge transport organic material layer 3c. Subsequently, HAT-CN6 (formula 1) was deposited on the layer 3c to form a HAT-CN6 film having a 5 nm thickness as a hole injection material layer 3d, for preparation of the intermediate layer 3.

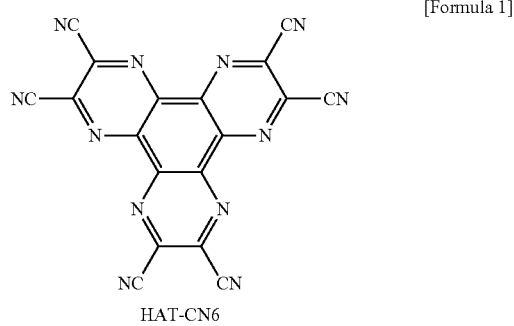 [SMILES: N#Cc1nc2c3nc(C#N)c(C#N)nc3c3nc(C#N)c(C#N)nc3c2nc1C#N]

[Formula 1]

HAT-CN6

Next, alpha-NPD was vapor deposited on the intermediate layer 3 to form an alpha-NPD film having a thickness of 40 nm as a hole transport layer. Then, Alq$_3$ and quinacridone were vapor co-deposited on the hole transport layer to form an Alq$_3$ film (containing 7% by weight of quinacridone) having a thickness of 30 nm as a light emitting layer 4b.

Next, BCP was deposited on the light emitting layer 4b to form an BCP film having a thickness of 40 nm as an electron transport layer. Then, LiF was deposited to form an LiF film having a thickness of 0.5 nm.

Subsequently, Al was vapor deposited at a rate of 0.4 nm per second to form an Al film having a dimension of 5 mm in width and 100 nm in thickness as a cathode 2, as shown in FIG. 2.

The above procedure makes it possible to provide an electroluminescence device shown in FIG. 1 in which the light emitting layer 4 is composed of two layers with the intermediate layer 3 being interposed therebetween. The hole injection layer, the hole transport layer and the electron transport layer are not shown in FIG. 1.

Example 2

Na and Li$_2$MoO$_4$ were vapor deposited by a resistive heating deposition on the BCP layer acting as the first electron transport layer provided on the light emitting layer 4a in example 1, so as to form a Na/Li$_2$MoO$_4$ laminate film having a 5 nm thickness as the layer 3a. The resultant layer 3a is formed as a laminate composed of an Na film having a 1 nm thickness and an Li$_2$MoO$_4$ layer having a 4 nm thickness. Then, ZnO was deposited by the resistive heating deposition on the layer 3a to form a ZnO film having a 5 nm thickness as an electrically conductive material-containing light transmissive layer 3b. The layers 3c,3d are formed in the same way as in Example 1, for preparation of the intermediate layer 3. Other layers were prepared in the same way as in Example 1 to provide an electroluminescent device.

Example 3

Li$_2$WO$_4$ was vapor deposited by the resistive heating deposition on the BCP layer acting as the first electron transport layer which is provided on the light emitting layer 4a in Example 1, so as to form an Li$_2$WO$_4$ film having a 1 nm thickness as the layer 3a. Then, Al was deposited on the layer 3a to form an Al film having a 1.5 nm thickness as the electrically conductive material-containing light transmissive layer 3b. Next, Alq$_3$ was deposited on the layer 3b to form an Alq$_3$ film having a 5 nm thickness as the charge transport organic material layer 3c. Subsequently, HAT-CN6 was deposited on the layer 3c to form an HAT-CN6 layer having a 5 nm thickness as the hole injection material layer 3d, for preparation of the intermediate layer 3. Other layers were prepared in the same way as in Example 1 to provide an electroluminescent device.

Example 4

Li$_2$O was vapor deposited by the resistive heating deposition on the BCP layer acting as the first electron transport layer which is provided on the light emitting layer 4a in Example 1, so as to form an Li$_2$O film having a 5 nm thickness as the layer 3a. Then, Al was vapor deposited by the resistive heating deposition on the layer 3a, so as to form an Al film having a 1.5 nm thickness as the electrically conductive material-containing light transmissive layer 3b. Next, Alq$_3$ was deposited on the layer 3b to form an Alq$_3$ film having a 5 nm thickness as the charge transport organic material layer 3c. Subsequently, F4-TCNQ was vapor deposited on the layer 3c to form an F4-TCNQ film having a 3 nm thickness as the hole injection material layer 3d, for preparation of the intermediate layer 3. Other layers were prepared in the same way as in Example 1 to provide an electroluminescent device.

Example 5

Alq$_3$ and Rb were co-deposited on the BCP layer acting as the first electron transport layer which is provided on the light emitting layer 4a in example 1, so as to form an Alq$_3$/Rb mixture (1:1 molar ratio) film having a 5 nm thickness as the layer 3a. Then, In$_2$O$_3$ and Al were vapor co-deposited by the resistive heating deposition on the layer 3a, so as to form an In$_2$O$_3$/Al (10:1 molar ratio) film having a 1.5 nm thickness as the electrically conductive material-containing light transmissive layer 3b. Next, NPD and Alq$_3$ were co-deposited on the layer 3b to form an NPD/Alq$_3$ mixture (1:1 molar ratio) layer having a 5 nm thickness as the charge transport organic material layer 3c. Subsequently, MoO$_3$ and NPD were co-deposited on the layer 3c to form an MoO$_3$/NPD mixture (1:1 molar ratio) film (serving as a p-dope layer) having a 3 nm thickness as the hole injection material layer 3d, for preparation of the intermediate layer 3. Other layers were prepared in the same way as in Example 1 to provide an electroluminescent device.

Example 6

BCP and K were deposited on the BCP layer acting as the first electron transport layer which is provided on the light emitting layer 4a in example 1, so as to form an BCP/K mixture (1:1 molar ratio) film having a 5 nm thickness as the layer 3a. Then, IZO was deposited by a spattering on the layer 3a to form an IZO film having a 2 nm thickness as the electrically conductive material-containing light transmissive layer 3b. Next, bipolar spiro-DPVBi was deposited on the layer 3b to form a spiro-DPVBi film having a 5 nm thickness as the charge transport organic material layer 3c. Subsequently, F4-TCNQ and NPD were deposited on the layer 3c to form an F4-TCNQ/NPD mixture (2:98 molar ratio) film having a 3 nm thickness as the hole injection material layer 3d acting as the p-dope layer, for preparation of the intermediate layer 3. Other layers were prepared in the same way as in Example 1 to provide an electroluminescent device.

Example 7

$Alq_3$ and Cs were deposited on the BCP layer acting as the first electron transport layer which is provided on the light emitting layer 4a in example 1, so as to form an $Alq_3$/Cs mixture (1:0.5 molar ratio) film having a 5 nm thickness as the layer 3a. Then, Mg and Ag were vapor co-deposited on the layer 3a to form an Mg/Ag (1:1 molar ratio) film having a 3 nm thickness as the electrically conductive material-containing light transmissive layer 3b. Next, NPD was deposited on the layer 3b to form an NPD film (exhibiting a hole-transporting performance) having a 5 nm thickness as the charge transport organic material layer 3c. Subsequently, HAT-CN6 and NPD were deposited on the layer 3c to form an HAT-CN6/NPD mixture (1:4 molar ratio) film (acting as a p-dope layer) having a 10 nm thickness as the hole injection material layer 3d, for preparation of the intermediate layer 3. Other layers were prepared in the same way as in Example 1 to provide an electroluminescent device.

Example 8

$Li_2WO_4$ and Li were vapor co-deposited on the BCP layer acting as the first electron transport layer which is provided on the light emitting layer 4a in example 1, so as to form an $Li_2WO_4$/Li (4:1 molar ratio) film having a 5 nm thickness as the layer 3a. Then, $In_2O_3$ and Li were vapor co-deposited on the layer 3a to form an $In_2O_3$/Li (10:1 molar ratio) film having a 5 nm thickness as the electrically conductive material-containing light transmissive layer 3b. Next, bipolar spiro-DPVBi was deposited on the layer 3b to form a spiro-DPVBi film having a 5 nm thickness as the charge transport organic material layer 3c. Subsequently, HAT-CN6 was deposited on the layer 3c to form an HAT-CN6 film having a 10 nm thickness as the hole injection material layer 3d, for preparation of the intermediate layer 3. Other layers were prepared in the same way as in Example 1 to provide an electroluminescent device.

Example 9

Al was deposited to form an Al film having a 10 nm thickness as the electrically conductive material-containing light transmissive layer 3b. Other layers were prepared in the same way as in Example 3 to provide an electroluminescent device.

Example 10

Li was vapor deposited by the resistive heating deposition on the BCP layer acting as the first electron transport layer which is provided on the light emitting layer 4a in Example 1, so as to form an Li film having a 1 nm thickness as the layer 3a. Then, Al was deposited on the layer 3a to form an Al film having a 2 nm thickness as the electrically conductive material-containing light transmissive layer 3b. Next, $Alq_3$ was deposited on the layer 3b to form an $Alq_3$ film having a 5 nm thickness as the charge transport organic material layer 3c. Subsequently, HAT-CN6 was deposited on the layer 3c to form an HAT-CN6 film having a 5 nm thickness as the hole injection material layer 3d, for preparation of the intermediate layer 3. Other layers were prepared in the same way as in Example 1 to provide an electroluminescent device.

Example 11

Na was vapor deposited by the resistive heating deposition on the BCP layer acting as the first electron transport layer which is provided on the light emitting layer 4a in example 1, so as to form an Na film having a 1 nm thickness as the layer 3a. Then, Al was deposited on the layer 3a to form an Al film having a 1 nm thickness as the electrically conductive material-containing light transmissive layer 3b. Next, $Alq_3$ was deposited on the layer 3b to form an $Alq_3$ film having a 5 nm thickness as the charge transport organic material layer 3c. Subsequently, F4-TCNQ was deposited on the layer 3c to form an F4-TCNQ film having a 3 nm thickness as the hole injection material layer 3d, for preparation of the intermediate layer 3. Other layers were prepared in the same way as in Example 1 to provide an electroluminescent device.

Example 12

Li was vapor deposited by the resistive heating deposition on the BCP layer acting as the first electron transport layer which is provided on the light emitting layer 4a in Example 1, so as to form an Li film having a 2 nm thickness as the layer 3a. Then, IZO was deposited by spattering on the layer 3a to form an IZO film having a 3 nm thickness as the electrically conductive material-containing light transmissive layer 3b. Next, $Alq_3$ was deposited on the layer 3b to form an $Alq_3$ film having a 5 nm thickness as the charge transport organic material layer 3c. Subsequently, HAT-CN6 was deposited on the layer 3c to form an HAT-CN6 film having a 5 nm thickness as the hole injection material layer 3d, for preparation of the intermediate layer 3. Other layers were prepared in the same way as in Example 1 to provide an electroluminescent device.

Example 13

Li was vapor deposited by the resistive heating deposition on the BCP layer acting as the first electron transport layer which is provided on the light emitting layer 4a in example 1, so as to form an Li film having a 2 nm thickness as the layer 3a. Then, Mg was deposited on the layer 3a to form an Mg film having a 1.5 nm thickness as the electrically conductive material-containing light transmissive layer 3b. Next, $Alq_3$ was deposited on the layer 3b to form an $Alq_3$ film having a 5 nm thickness as the charge transport organic material layer 3c. Subsequently, HAT-CN6 was deposited on the layer 3c to form an HAT-CN6 film having a 5 nm thickness as the hole injection material layer 3d, for preparation of the intermediate layer 3. Other layers were prepared in the same way as in Example 1 to provide an electroluminescent device.

Example 14

Na was vapor deposited by the resistive heating deposition on the BCP layer acting as the first electron transport layer which is provided on the light emitting layer 4a in Example 1, so as to form an Na film having a 2 nm thickness as the layer 3a. Then, Ca was deposited on the layer 3a to form a Ca film having a 2 nm thickness as the electrically conductive material-containing light transmissive layer 3b. Next, Alq$_3$ was deposited on the layer 3b to form an Alq$_3$ film having a 5 nm thickness as the charge transport organic material layer 3c. Subsequently, HAT-CN6 was deposited on the layer 3c to form an HAT-CN6 film having a 5 nm thickness as the hole injection material layer 3d, for preparation of the intermediate layer 3. Other layers were prepared in the same way as in Example 1 to provide an electroluminescent device.

Conventional Example 1

Alq$_3$ and Li were deposited on the BCP layer acting as the first electron transport layer which is provided on the light emitting layer 4a in Example 1, so as to form an Alq$_3$/Li film (1:1 molar ratio) film having a 5 nm thickness as the charge transfer complex layer 3a. Then, Al was deposited on the charge transfer complex layer 3a to form an Al film having a 80 nm thickness as the cathode 2, so as to provide an electroluminescent device in which the light emitting device 4 is composed of the first light emitting layer 4a alone.

Conventional Example 2

HAT-CN6 was deposited on the ITO film acting as the anode 1 in Example 1 to form an HAT-CN6 film having a 5 nm thickness as the final layer 3d of the intermediate layer 3. Then, subsequent layers (the hole transport layer, the light emitting layer 4b, the electron transport layer, and the cathode 2) were prepared in the same way as in Example 1, so as to provide an electroluminescent device in which the light emitting device 4 is composed of the second light emitting layer 4b alone.

Comparative Example 1

The InO$_2$/Al co-deposited film of Example 5 was not formed as the electrically conductive material-containing light transmissive layer 3b. Other layers were formed in the same way as in Example 5 to provide an electroluminescent device.

Comparative Example 2

The Li$_2$O film of Example 4 was not formed as the layer 3a. Other layers were formed in the same way as in Example 4 to provide an electroluminescent device.

Comparative Example 3

The Alq$_3$ film of Example 4 was not formed as the charge transport organic material layer 3c. Other layers were formed in the same way as in Example 4 to provide an electroluminescent device.

Comparative Example 4

The F4-TCNQ/NPD film of Example 6 acting as the p-dope layer was not formed as the hole injection material layer 3d. Other layers were formed in the same way as in Example 6 to provide an electroluminescent device.

Comparative Example 5

The Alq$_3$ film was formed as the charge transport organic material layer 3c in almost the same way as in Example 3, but formed to have a 50 nm thickness. Other layers were formed in the same way as in Example 3 to provide an electroluminescent device.

Comparative Example 6

The Alq$_3$ film was formed as the charge transport organic material layer 3c in almost the same way as in Example 4, but formed to have a 0.5 nm thickness. Other layers were formed in the same way as in Example 4 to provide an electroluminescent device.

Comparative Example 7

The IZO deposited film of the Example 12 was not formed as the electrically conductive material-containing light transmissive layer 3b. Other layers were formed in the same way as in Example 12 to provide an electroluminescent device.

Table 1 shows properties and thicknesses of the charge transfer complex layer 3a (or the metal layer of the metal having the work function of 3.7 eV, the metal compound layer), the electrically conductive material-containing light transmissive layer 3b, the charge transport organic material layer 3c, and the hole injection material layer 3d, in the above Examples 1-14 and Comparative examples 1-7.

Table 1 also shows a transmission of the electrically conductive material-containing light transmissive layer 3b. The transmissions were measured for two electrically conductive material-containing light transmissive layers 3b having different thicknesses (5 nm and 10 nm) each provided on a quartz substrate, in order to obtain a mean absorbance in a wavelength range of 460 nm to 800 nm for calculating an absorbance per 5 nm in thickness. Based on the resultant absorbance per 5 nm in thickness, the transmission was calculated for the electrically conductive material-containing light transmissive layer 3b in each of Examples and Comparative examples.

TABLE 1

| | Layer 3a (charge transfer complex layer, metal layer of a metal having a work function of 3.7 eV or less, or a metal compound layer made of a compound of the metal) | Electrically conductive material-containing light transmissive layer 3b | Charge transport organic material layer 3c | Hole injection material layer 3d | Transmission of electrically conductive material-containing light transmissive layer 3b |
|---|---|---|---|---|---|
| Example 1 | Alq$_3$ and Li (1:1) 5 nm | Al 3 nm | BCP 5 nm | HAT-CN6 5 nm | 96% |
| Example 2 | Na(1 nm) + Li$_2$MoO$_4$ (5 nm) | ZnO 5 nm | BCP 5 nm | HAT-CN6 5 nm | 98% |
| Example 3 | Li$_2$WO$_4$ 1 nm | Al 1.5 nm | Alq$_3$ 5 nm | HAT-CN6 5 nm | 98% |
| Example 4 | LiO$_2$ 5 nm | Al 1.5 nm | Alq$_3$ 5 nm | F4-TCNQ 3 nm | 98% |
| Example 5 | Alq$_3$:Rb (1:1) 5 nm | In$_2$O$_3$:Al (10:1) 1.5 nm | NPD:Alq$_3$ (1:1) 5 nm | NPD:MoO$_3$ (1:1) 3 nm | 95% |
| Example 6 | BCP:K (1:1) 5 nm | IZO 2 nm | spiro-DPVBi 5 nm | F4-TCNQ:NPD (2:98) 3 nm | 98% |
| Example 7 | Alq$_3$:Cs (1:0.5) 5 nm | Mg:Ag (1:1) 3 nm | NPD 5 nm | NPD:HAT-CN6 (4:1) 10 nm | 97% |

TABLE 1-continued

| | Layer 3a (charge transfer complex layer, metal layer of a metal having a work function of 3.7 eV or less, or a metal compound layer made of a compound of the metal) | Electrically conductive material-containing light transmissive layer 3b | Charge transport organic material layer 3c | Hole injection material layer 3d | Transmission of electrically conductive material-containing light transmissive layer 3b |
|---|---|---|---|---|---|
| Example 8 | $Li_2WO_4$:Li (4:1) 5 nm | $In_2O_3$:Li (10:1) 5 nm | spiro-DPVBi 5 nm | HAT-CN6 10 nm | 96% |
| Example 9 | $Li_2WO_4$ 1 nm | Al 10 nm | $Alq_3$ 5 nm | HAT-CN6 5 nm | 70% |
| Example 10 | Li 1 nm | Al 2 nm | $Alq_3$ 5 nm | HAT-CN6 5 nm | 96% |
| Example 11 | Na 1 nm | Al 1 nm | $Alq_3$ 5 nm | F4-TCNQ 3 nm | 97% |
| Example 12 | Li 2 nm | IZO 3 nm | $Alq_3$ 5 nm | HAT-CN6 5 nm | 97% |
| Example 13 | Li 2 nm | Mg 1.5 nm | $Alq_3$ 5 nm | HAT-CN6 5 nm | 98% |
| Example 14 | Na 2 nm | Ca 2 nm | $Alq_3$ 5 nm | HAT-CN6 5 nm | 97% |
| Comparative example 1 | $Alq_3$:Rb (1:1) 5 nm | — | NPD:$Alq_3$ (1:1) 5 nm | NPD:$MoO_3$ (1:1) 3 nm | — |
| Comparative example 2 | — | Al 1.5 nm | $Alq_3$ 5 nm | HAT-CN6 5 nm | 98% |
| Comparative example 3 | $LiO_2$ 5 nm | Al 1.5 nm | — | F4-TCNQ 3 nm | 98% |
| Comparative example 4 | BCP:K (1:1) 5 nm | IZO 2 nm | spiro-DPVBi 5 nm | — | 98% |
| Comparative example 5 | $Li_2WaO_4$ 1 nm | Al 1.5 nm | $Alq_3$ 50 nm | HAT-CN6 5 nm | 98% |
| Comparative example 6 | $LiO_2$ 5 nm | Al 1.5 nm | $Alq_3$ 0.1 nm | F4-TCNQ 3 nm | 98% |
| Comparative example 7 | Li 2 nm | — | $Alq_3$ 5 nm | HAT-CN6 5 nm | 97% |

Example 9 exhibits a superior durability and sustainability as shown in Table 2 below, but gives a poor transmission performance resulting from excessive thickness of the electrically conductive material-containing light transmissive layer 3b.

A driving electric voltage was measured for each of Examples 1-14, Comparative examples 1-7 and Conventional examples 1-2, in response to an electric current of 10 mA/cm² applied thereto. A time duration for keeping brightness at 80% or more in response to an electric current of 40 mA/cm² applied thereto with respect to an initial brightness was also measured for each of Examples 1-14, Comparative examples 1-7 and Conventional examples 1-2. The obtained driving electric voltage and the time duration were shown in Table 2.

TABLE 2

| | Driving electric voltage | Time duration for keeping a brightness at 80% or more with respect to initial brightness |
|---|---|---|
| Conventional example 1 | 5.8 V | 600 hours |
| Conventional example 2 | 5.2 V | 500 hours |
| Example 1 | 11.1 V | 600 hours |
| Example 2 | 11.3 V | 620 hours |
| Example 3 | 11.3 V | 680 hours |
| Example 4 | 11.1 V | 670 hours |
| Example 5 | 10.9 V | 660 hours |
| Example 6 | 10.8 V | 620 hours |
| Example 7 | 10.7 V | 610 hours |
| Example 8 | 11.0 V | 600 hours |
| Example 9 | 11.4 V | 670 hours |
| Example 10 | 10.8 V | 670 hours |
| Example 11 | 10.8 V | 640 hours |
| Example 12 | 11.2 V | 650 hours |
| Example 13 | 11.6 V | 680 hours |
| Example 14 | 11.4 V | 670 hours |
| Comparative example 1 | 12.3 V | 530 hours |
| Comparative example 2 | 16.1 V | 300 hours |
| Comparative example 3 | 11.3 V | 510 hours |
| Comparative example 4 | 17.4 V | 340 hours |
| Comparative example 5 | 16.9 V | 500 hours |
| Comparative example 6 | 11.3 V | 510 hours |
| Comparative example 7 | 13.2 V | 600 hours |

Each device of Examples 1-14 exhibits a driving voltage substantially equal to the sum of driving voltages of devices of Conventional examples 1 and 2, demonstrating that the intermediate layer 3 serves to make a good connection between the devices of Conventional examples 1 and 2. Each device in Examples 1-14 gives a durability equal to those of Conventional examples 1-2, demonstrating that each intermediate layer 3 does not bring adverse effects on the devices. Each device of Examples 1-14 exhibits a light emitting performance equivalent to the sum of those of Conventional examples 1-2.

Each device of Comparative examples 1-7 exhibits a light emitting performance substantially equal to the sum of the light emitting performances of devices of Conventional examples 1-2. However, each device of Comparative examples 1, 5 and 7 exhibits a high electric voltage. Each device of Comparative examples 2 and 4 exhibits a substantially high driving electric voltage as well as a degenerated durability. Each device of Comparative examples 3 and 6 exhibits a low driving electric voltage substantially equal to that of each Example, as well as a relatively low durability.

The device of Examples 9 gives a good electric voltage and a good durability, but exhibits a poorer light emitting performance compared to the sum of those of the light emitting performances of Conventional examples 1 and 2. The poor light emitting performance is presumably attributed to a low light transmission at the layer 3b of the intermediate layer 3.

As described above, the organic electroluminescence device of the present invention is demonstrated to exhibit a moderately low driving voltage as well as superior durability.

REFERENCE SIGNS LIST

1 Anode
2 Cathode
3 Intermediate layer
3a Charge transfer complex layer, metal layer made of a metal having a work function of 3.7 eV or less, or metal compound layer made of a compound of the metal having the work function of 3.7 eV or less 3b Electrically conductive material-containing light transmissive layer
3c Charge transport organic material layer
3d Hole injection material layer
4(4a,4b) Light emitting layer
5 Substrate

The invention claimed is:

1. An organic electroluminescence device comprising:
an anode;
a cathode;
a plurality of light emitting layers being disposed between said anode and said cathode; and
an intermediate layer being disposed between said light emitting layers;
said intermediate layer comprising:
a charge transfer complex layer made of a charge transfer complex, a metal layer made of a metal having a work function of 3.7 eV or less, or a metal compound layer made of a compound of the metal having the work function of 3.7 eV or less;
a light transmissive layer containing an electrically conductive material;
a charge transport organic material layer formed of a charge transport organic material; and
a hole injection material layer formed of a hole injection material,
which are superimposed in this order;
wherein said charge transport organic material layer is formed to have a thickness in a range of 0.5 nm to 30 nm.

2. The organic electroluminescence device as set forth in claim 1, wherein said charge transport organic material layer is formed of an electron transport material.

3. The organic electroluminescence device as set forth in claim 1, wherein said charge transport organic material layer is formed of a hole transport material.

4. The organic electroluminescence device as set forth in claim 1, wherein said charge transport organic material layer is formed of either one of;
a mixture of a hole transport material and an electron transport material; and
a bipolar material.

5. The organic electroluminescence device as set forth in claim 1, wherein said light transmissive layer containing the electrically conductive material is formed of a layer selected from a group consisting of;
a layer made of at least one of a metal oxide and a metal nitride;
a laminate layer which is formed of a laminate containing a metal layer made of a metal and a metal oxide layer made of a metal oxide;
a mixture layer made of a mixture of a metal and a metal oxide; and
a metal layer made of a metal.

6. The organic electroluminescence device as set forth in claim 1, wherein said light transmissive layer containing the electrically conductive material is formed to exhibit a light transmission of 80% or more.

7. The organic electroluminescence device as set forth in claim 1, wherein said hole injection material layer is formed of either one of a p-dope layer and an acceptor material layer made of an acceptor material.

8. A process of fabricating the organic electroluminescence device as set forth in claim 1, wherein said intermediate layer is prepared by steps of:
forming said charge transfer complex layer made of the charge transfer complex, said metal layer made of the metal having the work function of 3.7 eV or less, or said metal compound layer made of the compound of the metal having the work function of 3.7 eV or less, on one of said light emitting layers;
forming said light transmissive layer containing the electrically conductive material on a surface of one of said charge transfer complex layer, said metal layer and said metal compound layer;
laminating said charge transport organic material layer on a surface of said light transmissive layer containing the electrically conductive material; and
forming said hole injection material layer made of the hole injection material, on a surface of said charge transport organic material layer.

9. The organic electroluminescence device as set forth in claim 2, wherein said light transmissive layer containing the electrically conductive material is formed of a layer selected from a group consisting of;
a layer made of at least one of a metal oxide and a metal nitride;
a laminate layer which is formed of a laminate containing a metal layer made of a metal and a metal oxide layer made of a metal oxide;
a mixture layer made of a mixture of a metal and a metal oxide; and
a metal layer made of a metal.

10. The organic electroluminescence device as set forth in claim 3, wherein said light transmissive layer containing the electrically conductive material is formed of a layer selected from a group consisting of;
a layer made of at least one of a metal oxide and a metal nitride;
a laminate layer which is formed of a laminate containing a metal layer made of a metal and a metal oxide layer made of a metal oxide;
a mixture layer made of a mixture of a metal and a metal oxide; and
a metal layer made of a metal.

11. The organic electroluminescence device as set forth in claim 4, wherein said light transmissive layer containing the electrically conductive material is formed of a layer selected from a group consisting of;
a layer made of at least one of a metal oxide and a metal nitride;
a laminate layer which is formed of a laminate containing a metal layer made of a metal and a metal oxide layer made of a metal oxide;
a mixture layer made of a mixture of a metal and a metal oxide; and
a metal layer made of a metal.

12. The organic electroluminescence device as set forth in claim 2, wherein said light transmissive layer containing the electrically conductive material is formed to exhibit a light transmission of 80% or more.

13. The organic electroluminescence device as set forth in claim 4, wherein said light transmissive layer containing the electrically conductive material is formed to exhibit a light transmission of 80% or more.

14. The organic electroluminescence device as set forth in claim 5, wherein said light transmissive layer containing the electrically conductive material is formed to exhibit a light transmission of 80% or more.

15. The organic electroluminescence device as set forth in claim 2, wherein said hole injection material layer is formed of either one of a p-dope layer and an acceptor material layer made of an acceptor material.

16. The organic electroluminescence device as set forth in claim 4, wherein said hole injection material layer is formed of either one of a p-dope layer and an acceptor material layer made of an acceptor material.

17. The organic electroluminescence device as set forth in claim 5, wherein said hole injection material layer is formed of either one of a p-dope layer and an acceptor material layer made of an acceptor material.

18. A process of fabricating the organic electroluminescence device as set forth in claim 2, wherein said intermediate layer is prepared by steps of:
   forming said charge transfer complex layer made of the charge transfer complex, said metal layer made of the metal having the work function of 3.7 eV or less, or said metal compound layer made of the compound of the metal having the work function of 3.7 eV or less, on one of said light emitting layers;
   forming said light transmissive layer containing the electrically conductive material on a surface of one of said charge transfer complex layer, said metal layer and said metal compound layer;
   laminating said charge transport organic material layer on a surface of said light transmissive layer containing the electrically conductive material; and
   forming said hole injection material layer made of the hole injection material, on a surface of said charge transport organic material layer.

19. A process of fabricating the organic electroluminescence device as set forth in claim 4, wherein said intermediate layer is prepared by steps of:
   forming said charge transfer complex layer made of the charge transfer complex, said metal layer made of the metal having the work function of 3.7 eV or less, or said metal compound layer made of the compound of the metal having the work function of 3.7 eV or less, on one of said light emitting layers;
   forming said light transmissive layer containing the electrically conductive material on a surface of one of said charge transfer complex layer, said metal layer and said metal compound layer;
   laminating said charge transport organic material layer on a surface of said light transmissive layer containing the electrically conductive material; and
   forming said hole injection material layer made of the hole injection material, on a surface of said charge transport organic material layer.

20. A process of fabricating the organic electroluminescence device as set forth in claim 5, wherein said intermediate layer is prepared by steps of:
   forming said charge transfer complex layer made of the charge transfer complex, said metal layer made of the metal having the work function of 3.7 eV or less, or said metal compound layer made of the compound of the metal having the work function of 3.7 eV or less, on one of said light emitting layers;
   forming said light transmissive layer containing the electrically conductive material on a surface of one of said charge transfer complex layer, said metal layer and said metal compound layer;
   laminating said charge transport organic material layer on a surface of said light transmissive layer containing the electrically conductive material; and
   forming said hole injection material layer made of the hole injection material, on a surface of said charge transport organic material layer.

* * * * *